(12) United States Patent
Chen et al.

(10) Patent No.: US 12,418,988 B2
(45) Date of Patent: Sep. 16, 2025

(54) INDUCTOR-INTEGRATING EMBEDDED SUPPORT FRAME AND SUBSTRATE, AND MANUFACTURING METHOD THEREOF

(71) Applicant: Zhuhai ACCESS Semiconductor Co., Ltd, Guangdong (CN)

(72) Inventors: Xianming Chen, Guangdong (CN); Wenshi Wang, Guangdong (CN); Lei Feng, Guangdong (CN); Benxia Huang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 797 days.

(21) Appl. No.: 17/683,697

(22) Filed: Mar. 1, 2022

(65) Prior Publication Data
US 2022/0285088 A1   Sep. 8, 2022

(30) Foreign Application Priority Data
Mar. 4, 2021 (CN) .......... 202110241375.7

(51) Int. Cl.
| | |
|---|---|
| H05K 1/18 | (2006.01) |
| H01F 17/00 | (2006.01) |
| H01F 17/04 | (2006.01) |
| H01F 27/29 | (2006.01) |
| H01F 41/02 | (2006.01) |
| H01F 41/04 | (2006.01) |
| H01L 23/31 | (2006.01) |
| H05K 1/16 | (2006.01) |
| H05K 3/46 | (2006.01) |

(52) U.S. Cl.
CPC ......... *H05K 1/185* (2013.01); *H01F 17/0013* (2013.01); *H01F 17/045* (2013.01); *H01F 27/292* (2013.01); *H01F 41/0246* (2013.01); *H01F 41/046* (2013.01); *H01L 23/3121* (2013.01); *H05K 1/165* (2013.01); *H05K 3/4682* (2013.01); *H01F 2017/048* (2013.01)

(58) Field of Classification Search
CPC ...... H05K 1/165; H05K 1/185; H05K 3/4697; H05K 2201/086; H01F 41/046; H01L 23/3121
See application file for complete search history.

(56) References Cited

U.S. PATENT DOCUMENTS

| | | | |
|---|---|---|---|
| 2018/0182532 A1* | 6/2018 | Stahr | ............... H01F 17/0013 |
| 2020/0005994 A1* | 1/2020 | Lee | ............... H05K 1/165 |
| 2021/0168944 A1* | 6/2021 | Baftiri | ............... H05K 1/185 |

* cited by examiner

*Primary Examiner* — Livius R. Cazan
(74) *Attorney, Agent, or Firm* — The PL Law Group, PLLC

(57) ABSTRACT

An inductor-integrating embedded support frame according to an embodiment of the present disclosure includes a core dielectric layer, a through-opening penetrating through the core dielectric layer, wherein the through-opening is used for embedding and installing a device, and an inductor, wherein the inductor includes a magnetic core embedded in the core dielectric layer and an inductance coil wound around the magnetic core, wherein at least one conductive copper pillar penetrating through the core dielectric layer is provided at the periphery of the through-opening and the inductor.

5 Claims, 5 Drawing Sheets

INDUCTOR-INTEGRATING EMBEDDED SUPPORT FRAME AND SUBSTRATE, AND MANUFACTURING METHOD THEREOF

CROSS-REFERENCE TO RELATED APPLICATION

This application claims the benefit under 35 USC § 119(a) of Chinese Patent Application No. 202110241375.7, filed on Mar. 4, 2021, in the China Intellectual Property Office, the entire disclosure of which is incorporated herein by reference for all purposes.

BACKGROUND

1. Technical Field

Embodiments of the present description relate to the technical field of semiconductor packaging, and more particularly to an inductor-integrating embedded support frame and substrate, and a manufacturing method thereof.

2. Background of the Invention

With the continuous development of electronic technology, the integration of consumer electronics such as computers and telecommunication equipment is increasingly high. The packaging method for an embedded chip using a support frame has been greatly developed and applied in practical production, meeting the market demand for miniaturization in size, light and thin features, and high integration of electronic devices. However, the embedded passive devices in the prior art can only be capacitors and resistors, and cannot embed inductors with a large volume. For an inductor with a large volume, the inductor can only be fixed to a pad of an embedded packaging substrate by means of surface mounting, and the manufacturing process of the technical solution is mature; however, since the secondary surface mounting is required, not only the production process and production cost are increased, but also the market demand for miniaturization and high integration cannot be met.

SUMMARY

In view of the above, it is an object of one or more embodiments of the present description to propose an inductor-integrating embedded support frame and embedded packaging substrate, and a manufacturing method of the same, so as to solve the technical problem that an embedded support frame cannot embed an inductor in the prior art.

In view of the above object, in a first aspect, one or more embodiments of the present description provide an inductor-integrating embedded support frame, including:
  a core dielectric layer;
  a through-opening penetrating through the core dielectric layer, wherein the through-opening is used for embedding and installing a device;
  and an inductor, wherein the inductor includes a magnetic core embedded in the core dielectric layer and an inductance coil wound around the magnetic core;
  wherein at least one conductive copper pillar penetrating through the core dielectric layer is provided at a periphery of the through-opening and the inductor.

Alternatively, the core dielectric layer includes benzocyclobutene resin, polyphenylene ether, polyimide, epoxy, or polyethylene.

Alternatively, the magnetic core includes a soft magnetic material selected from at least one of an iron powder core, a manganese zinc ferrite, and a nickel zinc ferrite.

Alternatively, the inductance coil includes inductance line layers on the upper surface and lower surface of the magnetic core and conductive copper pillars conductively connecting the inductance line layers on two sides of the magnetic core.

Alternatively, the shape of the magnetic core is selected from a solid rectangle, a hollow rectangle, and an annular shape.

In a second aspect, one or more embodiments of the present description provide an inductor-integrating embedded packaging substrate, including:
  the embedded support frame of any one item described above;
  and a device embedded in the through-opening, wherein a packaging material is filled between the device and a side wall of the through-opening;
  the upper surface and lower surface of the core dielectric layer are respectively provided with a first line layer and a second line layer, and the first line layer and the second line layer are conductively connected to each other via the conductive copper pillar.

Alternatively, a solder mask and a solder mask window are provided on the outer surfaces of the first line layer and the second line layer.

Alternatively, a terminal of the device is connected to the solder mask window through conductive copper pillar fan-out.

In a third aspect, one or more embodiments of the present description also provide a manufacturing method for an inductor-integrating embedded support frame, including steps as follows:
  (a) a first magnetic core, a first conductive copper pillar, and a first sacrificial copper pillar are formed on a surface of a temporary carrier plate, wherein the first conductive copper pillar is formed around the first magnetic core;
  (b) a first core dielectric layer is laminated on surfaces of the first magnetic core, the first conductive copper pillar, and the first sacrificial copper pillar, and the first core dielectric layer is thinned to expose a first end face of the first conductive copper pillar and the first sacrificial copper pillar;
  (c) the temporary carrier plate is removed, exposing second end faces of the first magnetic core, the first conductive copper pillar, and the first sacrificial copper pillar;
  (d) a second magnetic core, a second conductive copper pillar, and a second sacrificial copper pillar are formed on corresponding positions of the first magnetic core, the first conductive copper pillar, and the first sacrificial copper pillar, so that the second end faces of the first magnetic core, the first conductive copper pillar, and the first sacrificial copper pillar are connected in alignment with the second end faces of the second magnetic core, the second conductive copper pillar, and the second sacrificial copper pillar;
  (e) a second core dielectric layer is laminated on the second magnetic core, the second conductive copper pillar, and the second sacrificial copper pillar, and the second core dielectric layer is thinned to expose the first end faces of the second conductive copper pillar and the second sacrificial copper pillar;
  (f) an inductance line layer is formed on surfaces of the first core dielectric layer and the second core dielectric layer, and the inductance line layer is conductively connected with the first conductive copper pillar and the second conductive copper pillar distributed on a periphery of the first magnetic core and the second magnetic core to form a spiral inductance coil;

and (g) the sacrificial copper pillar is etched to form a through-opening which penetrates through the core dielectric layer. Alternatively, the temporary carrier plate includes a temporary carrier plate covered on both sides thereof with a double-layer copper foil.

Alternatively, step (a) further includes:

applying a first magnetic material layer on the surface of the temporary carrier plate, and etching the first magnetic material layer to form the first magnetic core;

applying a first photoresist layer on the temporary carrier plate, patterning to form a first pattern, and electroplating to form a first conductive copper pillar and a first sacrificial copper pillar, so that the first conductive copper pillar is formed around the first magnetic core;

and removing the first photoresist layer.

Alternatively, step (d) further includes:

applying a second magnetic material layer on the first core dielectric layer which exposes the first magnetic core, and etching the second magnetic material layer to form the second magnetic core at a position corresponding to the first magnetic core;

applying a second photoresist layer on the first core dielectric layer which exposes the second magnetic core, patterning to form a second pattern aligned with the first conductive copper pillar and the first sacrificial copper pillar, and electroplating to form the second conductive copper pillar and the second sacrificial copper pillar;

and removing the second photoresist layer so that the second end faces of the first magnetic core, the first conductive copper pillar, and the first sacrificial copper pillar are connected in alignment with the second end faces of the second magnetic core, the second conductive copper pillar, and the second sacrificial copper pillar.

Alternatively, step (f) further includes:

applying a seed layer on surfaces of the first core dielectric layer and the second core dielectric layer;

applying a third photoresist layer on the seed layer, patterning to form a third pattern, and electroplating to form the inductance line layer, wherein the inductance line layer is in conductive connection with the first conductive copper pillar and the second conductive copper pillar distributed on the periphery of the first magnetic core and the second magnetic core to form a spiral inductance coil;

and removing the third photoresist layer and etching to remove the seed layer.

In a fourth aspect, one or more embodiments of the present description also provide a manufacturing method for an inductor-integrating embedded packaging substrate, including:

adhering an adhesive layer on the surface of the embedded support frame according to any one item described above;

mounting a device on the adhesive layer exposed in the through-opening, and filling packaging material to fix the device;

and removing the adhesive layer.

Alternatively, steps, as follows, are further included:

after the adhesive layer is removed, a first line layer and a second line layer are respectively formed on two surfaces of the core dielectric layer, wherein the first line layer and the second line layer are conductively connected to each other via the conductive copper pillar;

and a solder mask and a solder mask window are formed on the outer surfaces of the first line layer and the second line layer.

It can be seen from the above that one or more embodiments of the present description provide an inductor-integrating embedded support frame and substrate, and manufacturing method thereof. By manufacturing an inductor in the embedded support frame while manufacturing the embedded support frame, there is no need for secondary mounting, thereby effectively reducing the production flow, making it to the benefit of reducing the production cost. At the same time, since the inductor has been integrated on the embedded support frame, the problem of increased packaging volume caused by the surface mounting of the inductor is effectively solved, and the embedded packaging requirements of miniaturization and high integration can be met.

BRIEF DESCRIPTION OF THE DRAWINGS

In order to more clearly illustrate one or more embodiments of the present description or the technical solutions in the prior art, a brief description will be given below with reference to the accompanying drawings which are required to be used in the description of the embodiments or the prior art. It is obvious that the accompanying drawings in the description below are merely one or more embodiments of the present description and that other drawings can be obtained according to these drawings by a person of ordinary skills in the art without involving any inventive effort.

FIG. 3B corresponds to a hollow rectangular magnetic core; FIG. 3C corresponds to an annular magnetic core;

DETAILED DESCRIPTION

The object, technical solutions, and advantages of the present disclosure will become more apparent from the detailed description set forth below when taken in conjunction with the specific embodiments and the accompanying drawings.

It should be noted that, unless otherwise defined, technical or scientific terms used in one or more embodiments of the present description shall have the ordinary meaning as understood by one of ordinary skills in the art to which this disclosure belongs. The use of the terms "first", "second", and the like in one or more embodiments herein does not denote any order, quantity, or importance, but rather is used to distinguish different constituent parts. The terms "comprising", "comprises", "including", "includes" and the like, mean that the elements or items preceding the terms encompass the elements or items listed after the terms and equivalents thereof, and do not exclude other elements or items. "Connected to" or "connected with" and like terms are not limited to physical or mechanical connections, but may include electrical connections, whether direct or indirect. "Up", "down", "left", "right", etc. are only used to indicate a relative positional relationship, which may change accordingly when the absolute position of the object being described changes.

Figure 1:
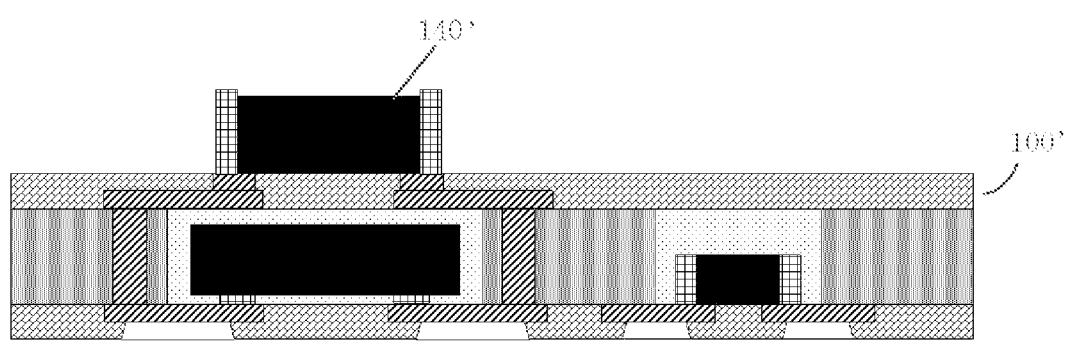
FIG. 1 is a schematic view of the structure of an embedded packaging substrate in the prior art.

FIG. 1 shows a schematic structural view of an embedded packaging substrate in the prior art. As shown in the figure, an embedded packaging substrate 100' embeds an active device and a capacitor and a resistor in the packaging substrate, but surface-mounts an inductor 140' on the surface of the substrate to complete electrical connection with other functional devices. The current production equipment for packaging substrates cannot meet the manufacturing requirements, and the technical solution of secondary mounting needs to be adopted, thereby not only requiring the electrode terminal of the inductor 140' to be a tin terminal and limiting the selection range of the inductor 140', but also increasing the process flow and the production cost. Furthermore, due to the large volume of the inductor 140', the embedded inductor 140' can significantly increase the thickness and volume of the packaging substrate, for example, the thickness reaching 3-5 mm, which cannot meet the miniaturization requirements of an integrated module, and the requirements of further high integration and miniaturization of the packaging device.

On that account, in the first aspect, one or more embodiments of the present description provide an inductor-integrating embedded support frame.

Figure 2:
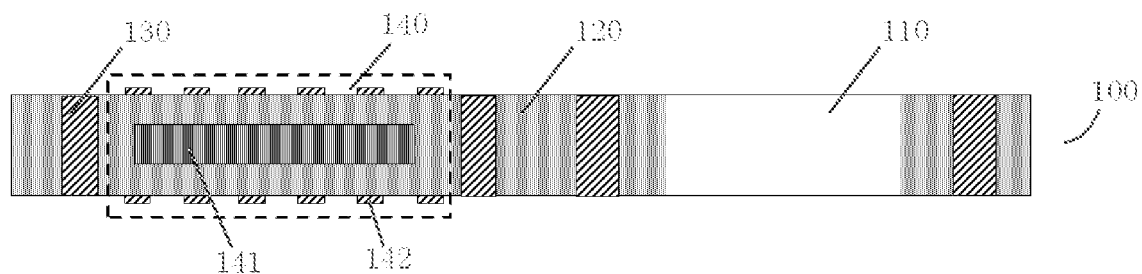
FIG. 2 is a schematic cross-sectional view of an inductor-integrating embedded support frame provided by an embodiment of the present description.

As shown in FIG. 2, the embedded support frame 100 includes a core dielectric layer 120; a through-opening 110 penetrating through the core dielectric layer 120, wherein the through-opening 110 is used for embedding and installing a device; and an inductor 140, wherein the inductor 140 includes a magnetic core 141 embedded in the core dielectric layer 120 and an inductance coil 142 wound around the magnetic core 141; wherein at least one conductive copper pillar 130 penetrating through the core dielectric layer 120 is provided at the periphery of the through-opening 110 and the inductor 140.

The embedded support frame, the inductor, and the through-opening for embedding and installing a device provided by embodiments of the present description are all embedded in the core dielectric layer, so that the inductor does not need to be mounted for the second time, thereby effectively reducing the production flow, making it beneficial to reducing the production cost; at the same time, since the inductor has been integrated on the embedded support frame, the problem of increased packaging volume caused by the surface mounting of the inductor is effectively solved, and the embedded packaging requirements of miniaturization and high integration can be met.

It should be noted that the device to be embedded may be either an active device or a passive device.

In some embodiments, the core dielectric layer includes benzocyclobutene resin, polyphenylene ether, polyimide, epoxy, or polyethylene.

In some embodiments, the magnetic core includes a soft magnetic material selected from at least one of an iron powder core, a manganese zinc ferrite, and a nickel zinc ferrite, such as an iron powder core.

Figure 3A:
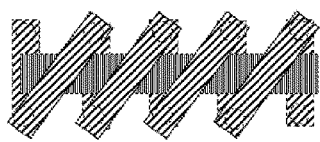
FIGS. 3A to 3C are schematic top views showing structures of inductors in an inductor-integrating embedded support frame provided in an embodiment of the present description; wherein FIG. 3A corresponds to a solid rectangular magnetic core.
Figure 3B:
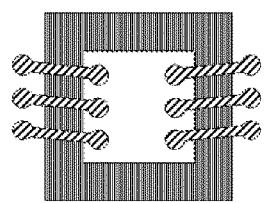
Figure 3C:
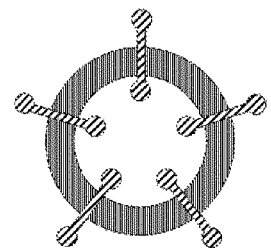

In some embodiments, referring to FIGS. 2-3C, the inductance coil includes inductance line layers on the upper surface and lower surface of the magnetic core and conductive copper pillars conductively connecting the inductance line layers on both sides of the magnetic core.

Alternatively, the shape of the magnetic core is selected from a solid rectangle (see FIG. 3A), a hollow rectangle (see FIG. 3B), and an annular shape (see FIG. 3C).

Figure 4:
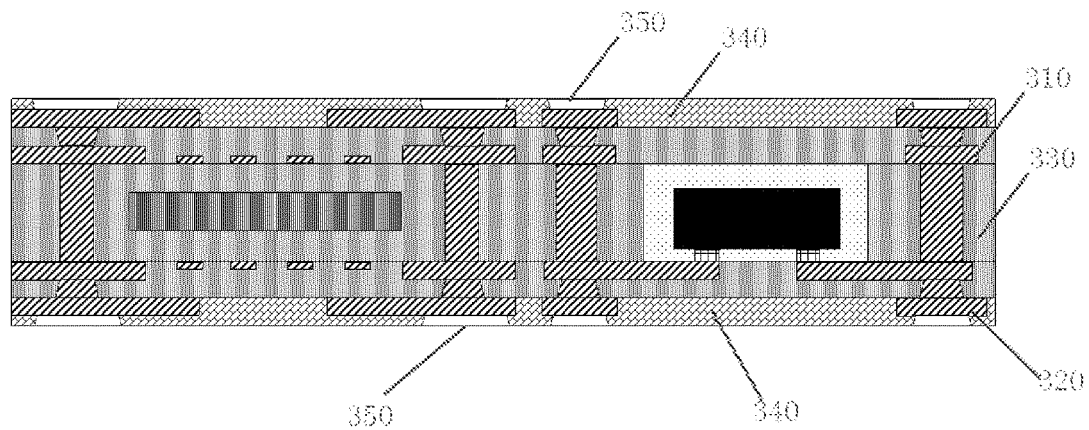
FIG. 4 is a schematic cross-sectional view of an embedded packaging substrate provided by an embodiment of the present description.

In a second aspect, as shown in FIG. 4, one or more embodiments of the present description also provide an embedded packaging substrate including the aforementioned embedded support frame; a device 360 embedded in the through-opening, wherein packaging material 370 is filled between the device 360 and a side wall of the through-opening; and a first line layer 310 and a second line layer 320 respectively provided on the upper surface and the lower surface of the core dielectric layer 330, wherein the first line layer 310 and the second line layer 320 are conductively connected to each other via a conductive copper pillar.

It should be understood that the substrate has all the technical features of the aforementioned embedded support frame and accordingly has a corresponding technical effect, which will not be described in detail herein.

In some embodiments, a solder mask 340 and a solder mask window 350 are provided on the outer surfaces of the first line layer 310 and the second line layer 320.

In some embodiments, the terminal of the device 360 is connected to the solder mask window 350 by conductive copper pillar fan-out.

Via such a structure, the inductor 140 and the connection terminal of the device can be made conductive to the outside by using the solder mask window 350.

In a third aspect, an embodiment of the present description also provides a manufacturing method for an inductor-integrating embedded support frame so that the inductor is formed when the embedded support frame is manufactured, thereby realizing the embedding of the inductor in the support frame.

Figure 5A:
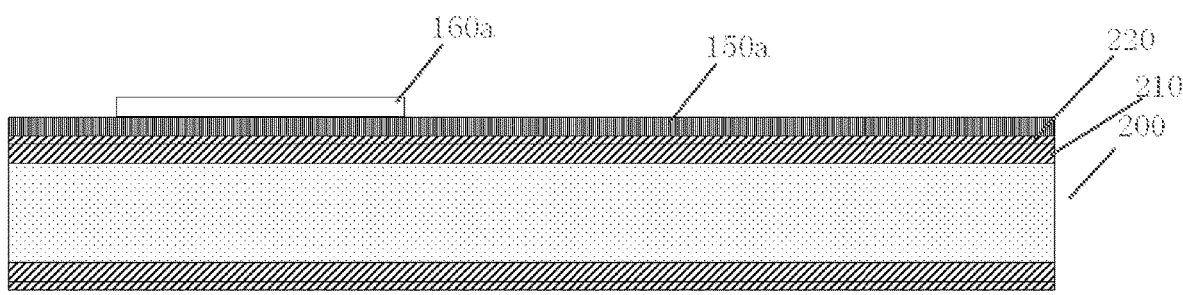
FIGS. 5A to 5H are schematic cross-sectional views of manufacturing steps for an inductor-integrating embedded support frame provided in an embodiment of the present description.
Figure 5B:
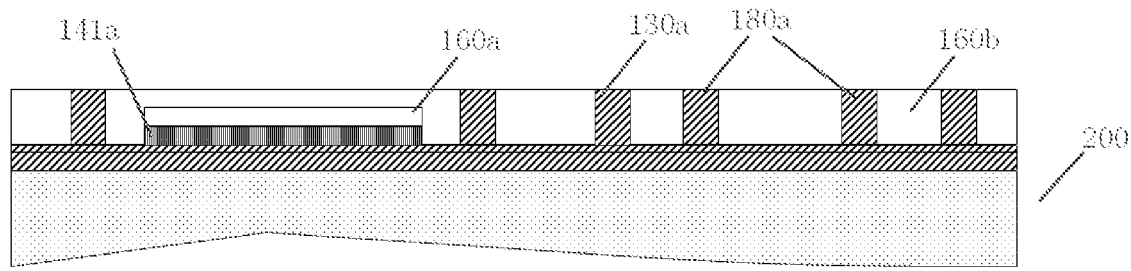

With reference to FIGS. 5A-5H, the manufacturing method for an inductor-integrating embedded support frame includes the following steps: forming a first magnetic core 141a, a first conductive copper pillar 130a and a first sacrificial copper pillar 180a on the surface of a temporary carrier plate, wherein the first conductive copper pillar 130a is formed around the first magnetic core 141a, step (a), as shown in FIGS. 5A-5B.

Generally, the temporary carrier plate may include a temporary carrier plate covered on both sides thereof with a double-layer copper foil. Specifically, referring to FIG. 5A, the temporary carrier plate may include a core layer 200, and double-layer copper foils attached to two surfaces of the core layer 200 respectively. Here, the double-layer copper foil includes a first copper foil 210 and a second copper foil 220 physically press-fitted together. Alternatively, the material of the core layer 200 may be a prepreg, a copper-clad plate, or a metal sheet. The prepreg includes a glass fiber reinforced epoxy material. Alternatively, the thickness of the first copper foil 210 close to the core layer 200 is greater than the thickness of the second copper foil 220. In this manner, not only can the need for subsequent stripping of the core layer 200 be met, but the small thickness of the second copper foil 220 facilitates the subsequent etching operation, and moreover, it is to the benefit of reducing etching costs.

It should be noted that two surfaces of the temporary carrier plate can be used to manufacture the support frame. In actual use, the support frame can be manufactured on two surfaces of the carrier plate at the same time, or alternatively, one of them can be selected to manufacture the support frame. FIGS. 5A-5B show only one surface of the support frame during the manufacturing.

In some embodiments, step (a) further includes:

(a1) applying a first magnetic material layer 150a on the surface of the temporary carrier plate, and etching the first magnetic material layer 150a to form the first magnetic core 141a. Alternatively, the method of applying the first magnetic layer 150a includes press-fitting, sputtering, plating, etc. and the method of etching to form the first magnetic core 141a includes wet chemical etching and dry etching. It should be understood that a person skilled in the art will be able to flexibly select suitable application means and etching method, which will not be limited herein.

It should be noted that, in order to form the first magnetic core 141a with a characteristic pattern by etching, a photoresist layer 160a is applied and patterned on the first magnetic layer 150a before etching.

With regard to the photoresist layer 160a, it is further described as follows: the photoresist includes a photosensitive dry film or a liquid photoresist; PCB photoresist is also known as photoresist or photoresist agent, which is changed into an etching-resistant thin film material through illumination or irradiation of ultraviolet light, deep ultraviolet light, electron beam, ion beam, X-ray, etc. so as to play the role of protecting and shielding the underlying structure. Some embodiments of the present application preferably use photosensitive dry film, but are not limited to photosensitive dry film.

It should be noted that more than one step of the embodiment of the present description relates to the photoresist, such as the first photoresist layer 160b, which is similar in function and material to the photoresist layer 160a, and will not be described later. (a2) Applying a first photoresist layer 160b on the temporary carrier plate, patterning to form a first pattern, and electroplating to form a first conductive copper pillar 130a and a first sacrificial copper pillar 180a, so that the first conductive copper pillar 130a is formed around the first magnetic core 141a, as shown in FIG. 5B. (a3) Removing the first photoresist layer 160b. Generally, a film stripping process may be used to remove the photoresist layer.

Those skilled in the art will understand that photoresist layer 160a is contained within the first photoresist layer 160b. Next, the first core dielectric layer 120a is laminated on the surfaces of the first magnetic core 141a, the first conductive copper pillar 130a and the first sacrificial copper pillar 180a, and the first core dielectric layer 120a is thinned to expose a first end face of the first conductive copper pillar 130a and the first sacrificial copper pillar 180a, step (b), as shown in FIG. 5C.

Generally, the first core dielectric layer 120a is thinned and planarized by a plate grinding process.

Figure 5C:
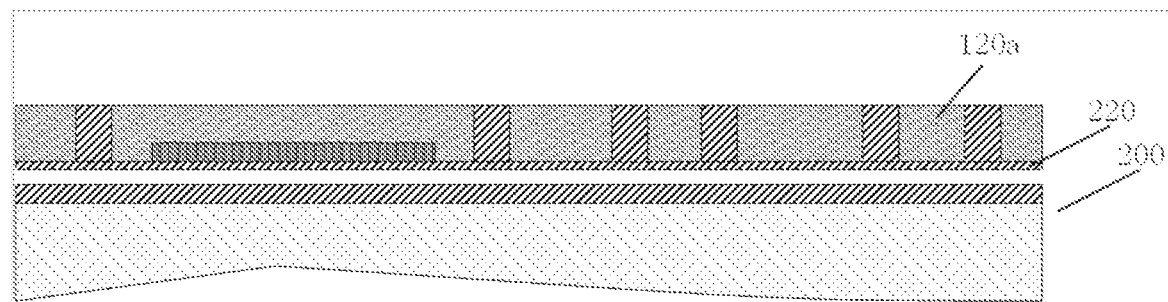

Then, the temporary carrier plate is removed, exposing the second end faces of the first magnetic core 141a, the first conductive copper pillar 130a and the first sacrificial copper pillar 180a, step (c), see FIG. 5C. Alternatively, the physically press-fitted double-layer copper foil is separated from the middle to remove the temporary carrier plate so that the second copper foil 220 is etched to expose the second end faces of the first magnetic core 141a, the first conductive copper pillar 130a, and the first sacrificial copper pillar 180a.

Figure 5D:
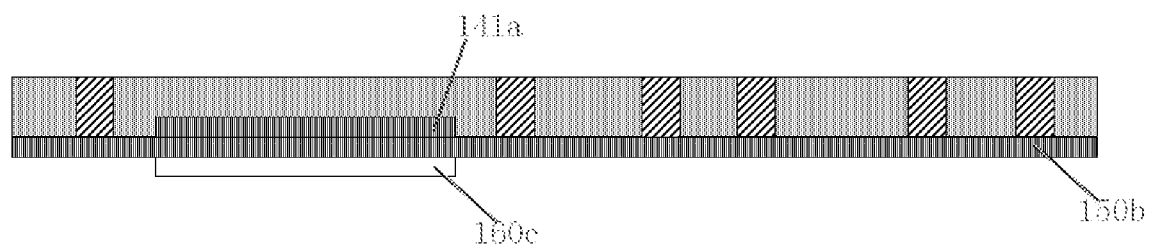
Figure 5E:
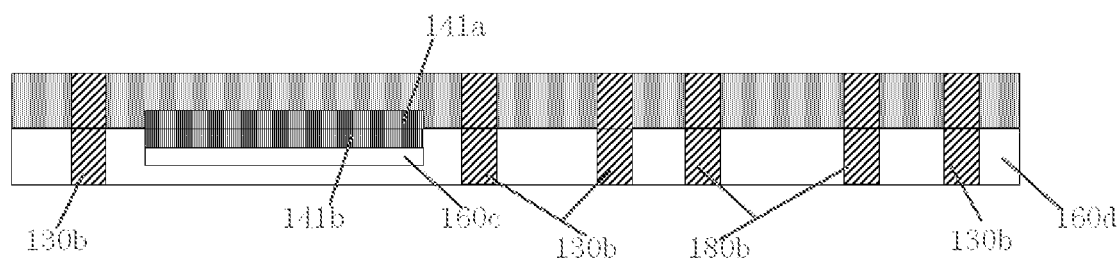
Figure 5F:
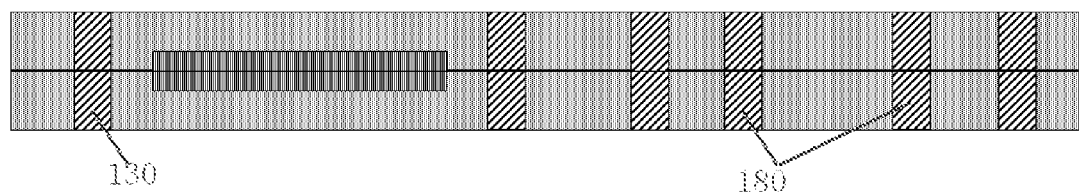

Then, a second magnetic core 141b, a second conductive copper pillar 130b and a second sacrificial copper pillar 180b are formed on the corresponding positions of the first magnetic core 141a, the first conductive copper pillar 130a, and the first sacrificial copper pillar 180a, so that the second end faces of the first magnetic core, the first conductive copper pillar, and the first sacrificial copper pillar are connected in alignment with the second end faces of the second magnetic core, the second conductive copper pillar, and the second sacrificial copper pillar, step (d), see FIGS. 5D-5F.

It should be noted that the first magnetic core 141a and the second magnetic core 141b together constitute a magnetic core; the first conductive copper pillar 130a and the second conductive copper pillar 130b together constitute a conductive copper pillar 130; the first sacrificial copper pillar 180a and the second sacrificial copper pillar 180b together constitute a sacrificial copper pillar 180 (see FIG. 5F). The shape of the magnetic core is not limited herein, and a person skilled in the art can design a suitable shape of the magnetic core as desired. As an example, referring to FIG. 3A to FIG. 3C, the shape of the magnetic core may be a solid rectangle, a hollow rectangular opening shape, an annular shape, and the like.

It should be noted that the second magnetic core 141b, the second conductive copper pillar 130b, and the second sacrificial copper pillar 180b are formed in a manner similar to the first magnetic core 141a, the first conductive copper pillar 130a, and the first sacrificial copper pillar 180a.

In some embodiments, step (d) further includes:

(d1) applying a second magnetic material layer 150b on the first core dielectric layer 120a which exposes the first magnetic core 141a, and etching the second magnetic material layer 150b to form the second magnetic core 141b at a position corresponding to the first magnetic core 141a, as shown in FIGS. 5D to 5E.

Alternatively, the material of the second magnetic layer 150b is consistent with that of the first magnetic layer 150a. The positions of the second magnetic core 141b and the first magnetic core 141a perfectly coincide and align. In order to form the second magnetic core 141b with a characteristic pattern by etching, a photoresist layer 160c is applied and patterned on the second magnetic layer 150b before etching (see FIG. 5D).

(d2) Applying a second photoresist layer 160d on the first core dielectric layer 120a which exposes the second magnetic core 141b, patterning to form a second pattern aligned with the first conductive copper pillar 130a and the first sacrificial copper pillar 180a, and electroplating to form the second conductive copper pillar 130b and the second sacrificial copper pillar 180b (as shown in FIG. 5E).

(d3) Removing the second photoresist layer 160d so that the second end faces of the first magnetic core 141a, the first conductive copper pillar 130a, and the first sacrificial copper pillar 180a are connected in alignment with the second end faces of the second magnetic core 141b, the second conductive copper pillar 130b, and the second sacrificial copper pillar 180b.

Then, a second core dielectric layer is laminated on the second magnetic core, the second conductive copper pillar, and the second sacrificial copper pillar, and the second core dielectric layer is thinned to expose the first end faces of the second conductive copper pillar 130b and the second sacrificial copper pillar 180b, step (e), as shown in FIG. 5F.

It should be noted that the second core dielectric layer is manufactured in the same manner as the first core dielectric layer, and the description thereof will not be repeated here, and the two together constitute the core dielectric layer. Alternatively, the material of the core dielectric layer includes at least one of prepreg, a thermosetting organic resin, and a thermoplastic organic resin. Alternatively, the thermosetting organic resin is selected from pelliculat resin (ABF), epoxy resin, polyester resin, vinyl ester resin, bismaleamic triazine resin (BT), polyimide, cyanate ester, and the like. Alternatively, the thermoplastic organic resin is selected from polyethylene, polyvinyl chloride, polypropylene, and the like.

Figure 5G:
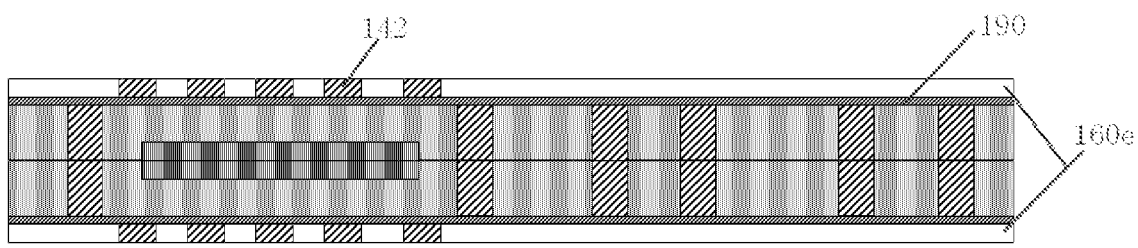

Next, an inductance line layer is formed on the surfaces of the first core dielectric layer and the second core dielectric layer, and the inductance line layer is conductively connected with the first conductive copper pillar and the second conductive copper pillar distributed on the periphery of the first magnetic core and the second magnetic core to form a spiral inductance coil 142, step (f), as shown in FIG. 5G.

In some embodiments, step (f) further includes:
(f1) applying a seed layer 190 on the surfaces of the first core dielectric layer and the second core dielectric layer.

The use of the seed layer 190 can improve the strength and stability of the inductance line layer. Alternatively, the material of the seed layer is a metal; alternatively, the metal includes titanium and/or copper.

(f2) Applying a third photoresist layer 160e on the seed layer 190, patterning to form a third pattern, and electroplating to form the inductance line layer 142, wherein the inductance line layer is in conductive connection with the first conductive copper pillar and the second conductive copper pillar distributed on the periphery of the first magnetic core and the second magnetic core to form a spiral inductance coil. Through such a step, the magnetic core 141 and the inductance coil 142 together constitute the inductor 140.

(f3) Removing the third photoresist layer and etching to remove the seed layer.

Figure 5H:
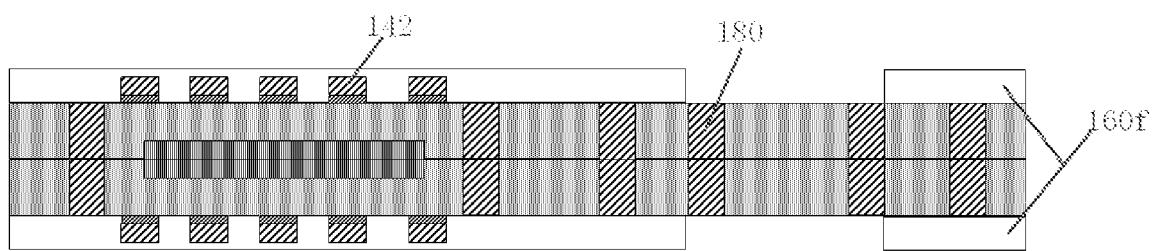

The sacrificial copper pillar is then etched to form a through-opening which penetrates through the core dielectric layer, step (g), as shown in FIG. 5H. Alternatively, a fourth photoresist layer 160f is applied and patterned to form a fourth pattern to expose sacrificial copper pillars 180 and a region therebetween. At this point the sacrificial copper pillar 180 can be selectively etched to form through-opening 110. Finally, the fourth photoresist layer 160f is removed by film stripping to obtain the inductor-integrating embedded support frame 100 (see FIG. 2).

It can be seen therefrom that in the technical solution of the embodiments of the present description, by embedding an inductor in the support frame while manufacturing the embedded support frame, there is no need for secondary mounting, thereby effectively reducing the production flow, making it to the benefit of reducing the production cost; at the same time, since the inductor has been integrated on the embedded support frame, the problem of increased packaging volume caused by the surface mounting of the inductor is effectively solved, and the embedded packaging requirements of miniaturization and high integration can be met.

In a fourth aspect, embodiments of the present disclosure also provide a manufacturing method for an inductor-integrating embedded packaging substrate, including:
adhering an adhesive layer on the surface of the embedded support frame;
mounting a device on the adhesive layer exposed in a through-opening, and filling packaging material to fix the device; and removing the adhesive layer.

With such a technical solution, it is possible to embed the device in the support frame, thereby enabling the packaging in which both the device and the inductor are embedded in the substrate at the same time.

In some embodiments, as shown in FIG. 4, the manufacturing method for the embedded packaging substrate further includes steps as follows:
after the adhesive layer is removed, a first line layer 310 and a second line layer 320 are respectively formed on two surfaces of core dielectric layer 330, wherein the first line layer 310 and the second line layer 320 are conductively connected to each other via a conductive copper pillar;
a solder mask 340 and a solder mask window 350 are formed on the outer surfaces of the first line layer and the second line layer.

In this way, the inductor 140 and the connection terminal of the device can be made conductive to the outside by using the solder mask window 350.

Those of ordinary skills in the art should understand that the discussion of any embodiment above is merely exemplary and is not intended to imply that the scope of the disclosure (including the claims) is limited to these examples; combinations of technical features in the above embodiments, or between different embodiments, may also be made under the concept of the present disclosure, the steps may be implemented in any order, and there may be many other variations, which are not provided in detail for clarity, of the aforementioned different aspects of one or more embodiments of the present description.

While the present disclosure has been described in conjunction with specific embodiments thereof, many replacements, modifications, and variations of these embodiments will be apparent to those of ordinary skills in the art in light of the foregoing description.

According to one or more embodiments of the present description, it is intended to embrace all such replacements, modifications, and variations as fall within the broad scope of the appended claims. Accordingly, any omissions, modifications, equivalents, improvements, etc. made should be included within the scope of the present disclosure as long as they are within the spirit and principles of one or more embodiments of the present description.

What is claimed is:

1. A method for manufacturing an inductor-integrating embedded support frame, the method comprising:
(a) a first magnetic core, a first conductive copper pillar, and a first sacrificial copper pillar are formed on a surface of a temporary carrier plate, wherein the first conductive copper pillar is formed around the first magnetic core;
(b) a first core dielectric layer is laminated on surfaces of the first magnetic core, the first conductive copper pillar, and the first sacrificial copper pillar, and the first core dielectric layer is thinned to expose a first end face of the first conductive copper pillar and the first sacrificial copper pillar;
(c) the temporary carrier plate is removed, exposing second end faces of the first magnetic core, the first conductive copper pillar, and the first sacrificial copper pillar;
(d) a second magnetic core, a second conductive copper pillar and a second sacrificial copper pillar are formed on corresponding positions of the first magnetic core, the first conductive copper pillar, and the first sacrificial copper pillar, so that the second end faces of the first magnetic core, the first conductive copper pillar, and the first sacrificial copper pillar are connected in alignment with the second end faces of the second magnetic core, the second conductive copper pillar, and the second sacrificial copper pillar;

(e) a second core dielectric layer is laminated on the second magnetic core, the second conductive copper pillar, and the second sacrificial copper pillar, and the second core dielectric layer is thinned to expose first end faces of the second conductive copper pillar and the second sacrificial copper pillar;

(f) an inductance line layer is formed on surfaces of the first core dielectric layer and the second core dielectric layer, and the inductance line layer is conductively connected with the first conductive copper pillar and the second conductive copper pillar distributed on a periphery of the first magnetic core and the second magnetic core to form a spiral inductance coil; and (g) the sacrificial copper pillars are etched to form a through-opening which penetrates through the core dielectric layers.

2. The method according to claim 1, wherein the temporary carrier plate comprises a temporary carrier plate covered on both sides thereof with a double-layer copper foil.

3. The method according to claim 1, wherein step (a) further comprises:

applying a first magnetic material layer on the surface of the temporary carrier plate, and etching the first magnetic material layer to form the first magnetic core;

applying a first photoresist layer on the temporary carrier plate, patterning to form a first pattern, and electroplating to form a first conductive copper pillar and a first sacrificial copper pillar, so that the first conductive copper pillar is formed around the first magnetic core; and removing the first photoresist layer.

4. The method according to claim 1, wherein step (d) further comprises:

applying a second magnetic material layer on the first core dielectric layer which exposes the first magnetic core, and etching the second magnetic material layer to form the second magnetic core at a position corresponding to the first magnetic core;

applying a second photoresist layer on the first core dielectric layer which exposes the second magnetic core, patterning to form a second pattern aligned with the first conductive copper pillar and the first sacrificial copper pillar, and electroplating to form the second conductive copper pillar and the second sacrificial copper pillar; and removing the second photoresist layer so that the second end faces of the first magnetic core, the first conductive copper pillar, and the first sacrificial copper pillar are connected in alignment with the second end faces of the second magnetic core, the second conductive copper pillar, and the second sacrificial copper pillar.

5. The method according to claim 1, wherein step (f) further comprises:

applying a seed layer on surfaces of the first core dielectric layer and the second core dielectric layer;

applying a third photoresist layer on the seed layer, patterning to form a third pattern, and electroplating to form the inductance line layer, wherein the inductance line layer is in conductive connection with the first conductive copper pillar and the second conductive copper pillar distributed on the periphery of the first magnetic core and the second magnetic core to form a spiral inductance coil; and removing the third photoresist layer and etching to remove the seed layer.

\* \* \* \* \*